(12) United States Patent
Chang et al.

(10) Patent No.: US 9,773,871 B2
(45) Date of Patent: Sep. 26, 2017

(54) FIN FIELD EFFECT TRANSISTOR AND METHOD FOR FABRICATING THE SAME

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/941,664

(22) Filed: Nov. 16, 2015

(65) Prior Publication Data

US 2017/0141189 A1  May 18, 2017

(51) Int. Cl.
| | |
|---|---|
| *H01L 29/78* | (2006.01) |
| *H01L 29/10* | (2006.01) |
| *H01L 27/088* | (2006.01) |
| *H01L 29/06* | (2006.01) |
| *H01L 29/08* | (2006.01) |
| *H01L 21/8234* | (2006.01) |
| *H01L 21/762* | (2006.01) |

(Continued)

(52) U.S. Cl.
CPC ...... *H01L 29/1083* (2013.01); *H01L 21/0228* (2013.01); *H01L 21/0262* (2013.01); *H01L 21/26506* (2013.01); *H01L 21/76224* (2013.01); *H01L 21/823431* (2013.01); *H01L 21/823481* (2013.01); *H01L 27/0886* (2013.01); *H01L 29/0649* (2013.01); *H01L 29/0847* (2013.01); *H01L 29/7848* (2013.01); *H01L 29/7851* (2013.01)

(58) Field of Classification Search
CPC .......... H01L 27/0886; H01L 21/31111; H01L 21/76224; H01L 21/823431; H01L 21/823481; H01L 29/0649; H01L 29/7848
See application file for complete search history.

(56) References Cited

U.S. PATENT DOCUMENTS

| | | | | |
|---|---|---|---|---|
| 7,323,710 B2 * | 1/2008 | Kim | ................. | H01L 29/66795 257/19 |
| 8,283,653 B2 * | 10/2012 | Pillarisetty | ............ | B82Y 10/00 257/14 |

(Continued)

FOREIGN PATENT DOCUMENTS

| | | |
|---|---|---|
| TW | 200503095 | 1/2005 |
| TW | 201334045 | 8/2013 |

OTHER PUBLICATIONS

"Office Action of Taiwan Counterpart Application", dated Jun. 12, 2017, p. 1-p. 6.

*Primary Examiner* — Earl Taylor
(74) *Attorney, Agent, or Firm* — Jianq Chyun IP Office

(57) ABSTRACT

A FinFET includes a substrate, a plurality of insulators disposed on the substrate, a gate stack and a strained material. The substrate includes at least one semiconductor fin and the semiconductor fin includes at least one modulation portion distributed therein. The semiconductor fin is sandwiched by the insulators. The gate stack is disposed over portions of the semiconductor fin and over portions of the insulators. The strained material covers portions of the semiconductor fin that are revealed by the gate stack. In addition, a method for fabricating the FinFET is provided.

19 Claims, 12 Drawing Sheets

(51) Int. Cl.
*H01L 21/265* (2006.01)
*H01L 21/02* (2006.01)

(56) References Cited

U.S. PATENT DOCUMENTS

| | | | | |
|---|---|---|---|---|
| 8,440,517 B2* | 5/2013 | Lin | ............... | H01L 29/66795 257/E21.224 |
| 8,575,596 B2* | 11/2013 | Pillarisetty | ............. | B82Y 10/00 257/24 |
| 8,941,153 B2* | 1/2015 | Lee | ............... | H01L 21/823431 257/288 |
| 9,153,671 B2* | 10/2015 | Pillarisetty | ............. | B82Y 10/00 |
| 9,236,444 B2* | 1/2016 | Rodder | ............. | H01L 29/66469 |
| 9,263,557 B2* | 2/2016 | Pillarisetty | ............. | B82Y 10/00 |
| 9,293,534 B2* | 3/2016 | Tsai | ............... | H01L 29/0847 |
| 2005/0184316 A1* | 8/2005 | Kim | ............... | H01L 29/66795 257/213 |
| 2006/0076625 A1* | 4/2006 | Lee | ............... | H01L 29/7851 257/353 |
| 2011/0079861 A1* | 4/2011 | Shifren | ............. | H01L 21/823412 257/402 |
| 2011/0133292 A1* | 6/2011 | Lee | ............... | H01L 21/823431 257/401 |
| 2011/0147711 A1* | 6/2011 | Pillarisetty | ............. | B82Y 10/00 257/24 |
| 2012/0074386 A1* | 3/2012 | Rachmady | ............. | B82Y 10/00 257/24 |
| 2012/0091538 A1* | 4/2012 | Lin | ............... | H01L 29/66795 257/401 |
| 2013/0032783 A1* | 2/2013 | Pillarisetty | ............. | B82Y 10/00 257/24 |
| 2013/0200455 A1* | 8/2013 | Lo | ............... | H01L 29/66795 257/347 |
| 2013/0228876 A1* | 9/2013 | Mor | ............... | H01L 29/66545 257/401 |
| 2013/0244387 A1* | 9/2013 | Cho | ............... | H01L 21/76224 438/283 |
| 2013/0273705 A1* | 10/2013 | Liu | ............... | H01L 21/823431 438/283 |
| 2014/0054548 A1* | 2/2014 | Pillarisetty | ............. | B82Y 10/00 257/24 |
| 2014/0103397 A1* | 4/2014 | Pillarisetty | ............. | B82Y 10/00 257/192 |
| 2014/0117419 A1* | 5/2014 | Juengling | ............. | H01L 21/823431 257/288 |
| 2014/0170840 A1* | 6/2014 | Tsai | ............... | H01L 29/68 438/492 |
| 2014/0353767 A1* | 12/2014 | Liu | ............... | H01L 21/845 257/401 |
| 2015/0076609 A1* | 3/2015 | Xie | ............... | H01L 29/785 257/365 |
| 2015/0129934 A1* | 5/2015 | Xie | ............... | H01L 27/0886 257/192 |
| 2015/0171217 A1* | 6/2015 | Kim | ............... | H01L 29/7851 257/401 |
| 2015/0179503 A1* | 6/2015 | Tsai | ............... | H01L 21/76224 257/347 |
| 2015/0179644 A1* | 6/2015 | Akarvardar | ..... | H01L 21/823431 257/401 |
| 2015/0228763 A1* | 8/2015 | Lin | ............... | H01L 29/66795 257/401 |
| 2015/0255542 A1* | 9/2015 | Cai | ............... | H01L 29/1054 257/401 |
| 2015/0270342 A1* | 9/2015 | Tsai | ............... | H01L 29/0847 257/43 |
| 2016/0172472 A1* | 6/2016 | Pillarisetty | ............. | B82Y 10/00 257/19 |

\* cited by examiner

FIN FIELD EFFECT TRANSISTOR AND METHOD FOR FABRICATING THE SAME

BACKGROUND

As the semiconductor devices keeps scaling down in size, three-dimensional multi-gate structures, such as the fin-type field effect transistor (FinFET), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the fin further provides a better electrical control over the channel.

During fabrication of the FinFET, fin profile is very critical for process window. Current FinFET process may suffer loading effect and fin-bending issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
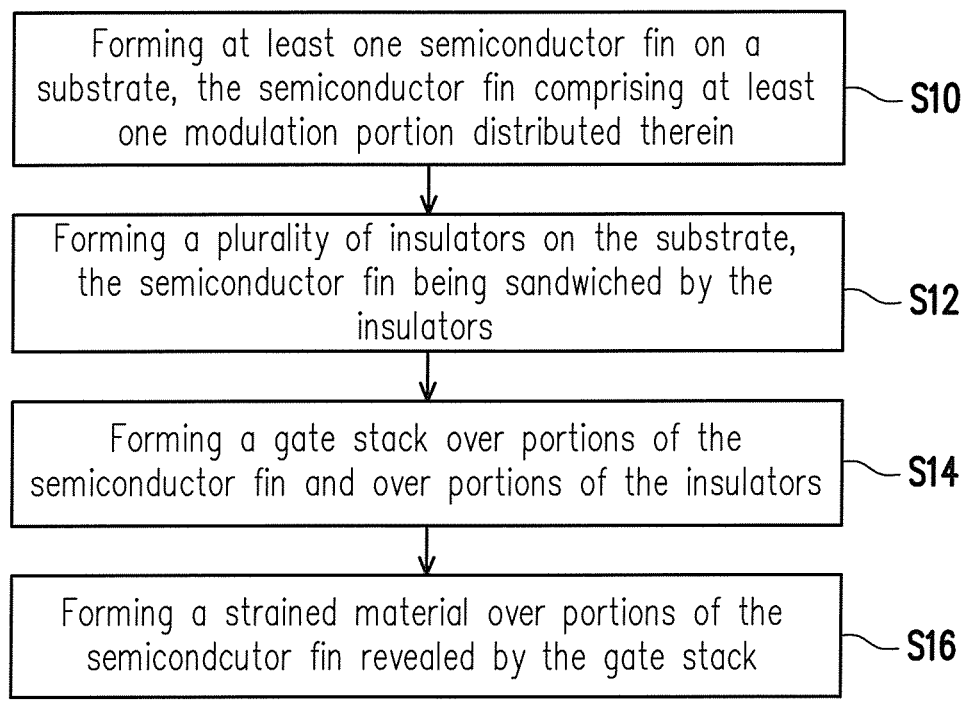
FIG. 1 is a flow chart illustrating a method for fabricating a FinFET in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing process of FinFETs and the FinFETs fabricated there-from. The FinFET may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

Referring to FIG. 1, illustrated is a flow chart illustrating a method for fabricating a FinFET in accordance with some embodiments of the present disclosure. The method at least includes steps S10, step S12, step S14 and step S16. First, in step S10, a substrate is provided and at least one semiconductor fin is formed thereon, wherein the semiconductor fin comprises at least one modulation portion distributed therein. Then, in step S12, insulators are formed on the substrate and the semiconductor fin is sandwiched by the insulators. The insulators are shallow trench isolation (STI) structures, for example. Thereafter, in step S14, a gate stack is formed over portions of the semiconductor fin and over portions of the insulators; in step S16, a strained material is formed on portions of the semiconductor fin. As illustrated in FIG. 1, the strained material is formed after formation of the gate stack. However, formation sequence of the gate stack (step S14) and the strained material (step S16) is not limited in the present disclosure.

Figure 2A:
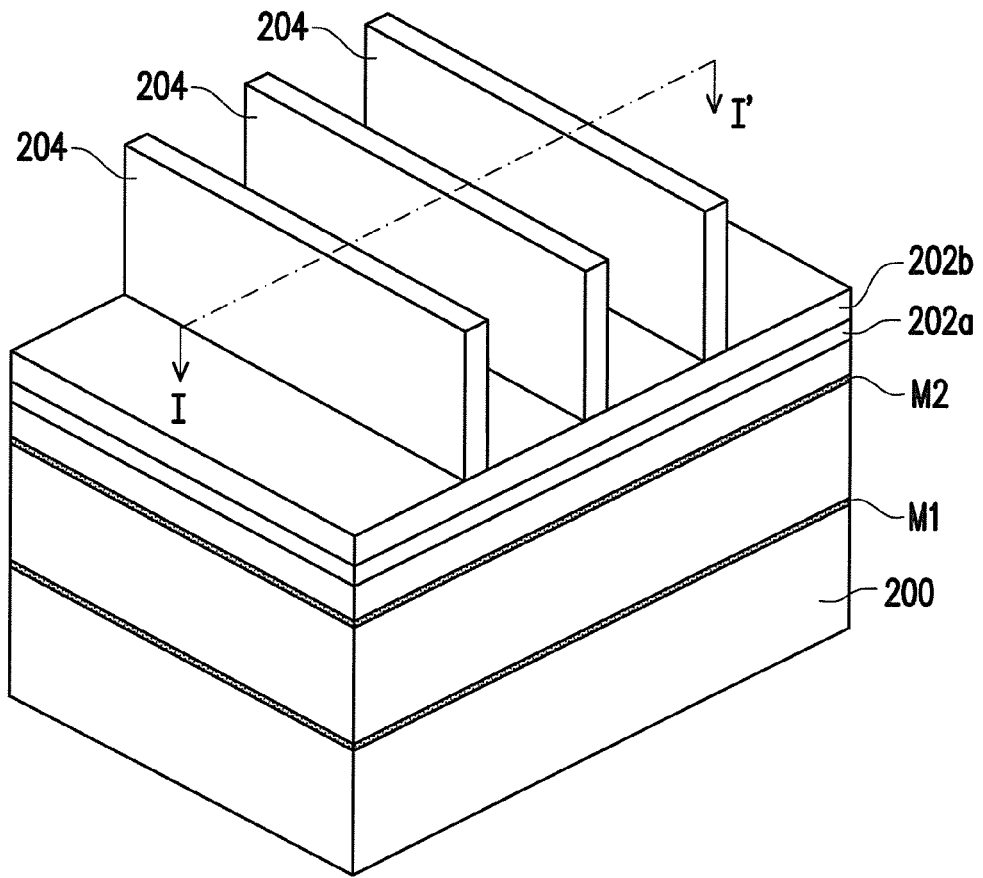
FIGS. 2A-2H are perspective views of a method for fabricating a FinFET in accordance with some embodiments.
Figure 3A:
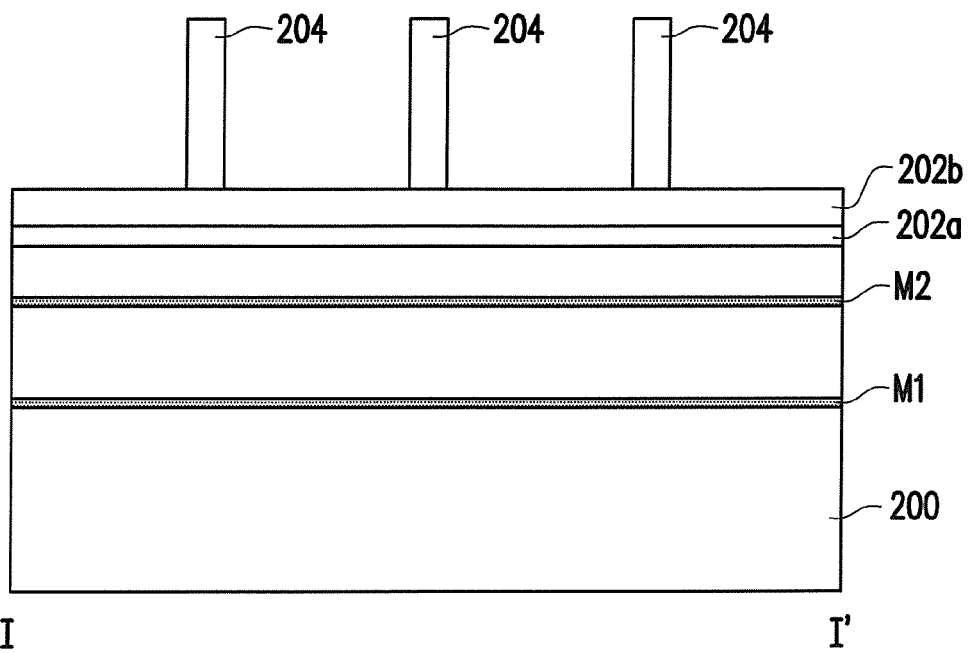
FIGS. 3A-3H are cross-sectional views of a method for fabricating a FinFET in accordance with some embodiments.

FIG. 2A is a perspective view of the FinFET at one of various stages of the manufacturing method, and FIG. 3A is a cross-sectional view of the FinFET taken along the line I-I' of FIG. 2A. In Step 10 in FIG. 1 and as shown in FIG. 2A and FIG. 3A, a substrate 200 is provided. In one embodiment, the substrate 200 comprises a crystalline silicon substrate (e.g., wafer). The substrate 200 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET. In some alternative embodiments, the substrate 200 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

As shown in FIG. 2A and FIG. 3A, the substrate 200 comprises two modulation materials M1 and M2 distributed therein, wherein the modulation materials M1, M2 are an implant regions formed by ion implantation or semiconductor layers formed by atomic layer deposition (ALD), for example. In some embodiments, the material of modulation materials M1 and M2 comprises silicon-germanium oxide ($SiGeO_x$, $0<x$), silicon-germanium (SiGe), silicon oxide ($SiO_x$, $0<x$), silicon phosphide (SiP), silicon phosphate ($SiPO_x$, $0<x<1$) or the combination thereof. The thickness of the modulation material M1 ranges from about 1 nm to about 50 nm and the thickness of the modulation material M2 ranges from about 1 nm to about 50 nm, for example. In some embodiments, through proper controls of implantation dosage and implantation depth, the modulation materials M1, M2 may be formed at different locations of the substrate 200 by ion implantation. In some alternative embodiments, an epitaxial layer (e.g. silicon epitaxial layer) between the deposited modulation materials M1 and M2 may be formed by an epitaxial process.

In one embodiment, a pad layer 202a and a mask layer 202b are sequentially formed on the substrate 200. The pad layer 202a may be a silicon oxide thin film formed, for example, by thermal oxidation process. The pad layer 202a may act as an adhesion layer between the substrate 200 and mask layer 202b. The pad layer 202a may also act as an etch stop layer for etching the mask layer 202b. In at least one embodiment, the mask layer 202b is a silicon nitride layer formed, for example, by low-pressure chemical vapor deposition (LPCVD) or plasma enhanced chemical vapor deposition (PECVD). The mask layer 202b is used as a hard mask during subsequent photolithography processes. A patterned photoresist layer 204 having a predetermined pattern is formed on the mask layer 202b.

Figure 2B:
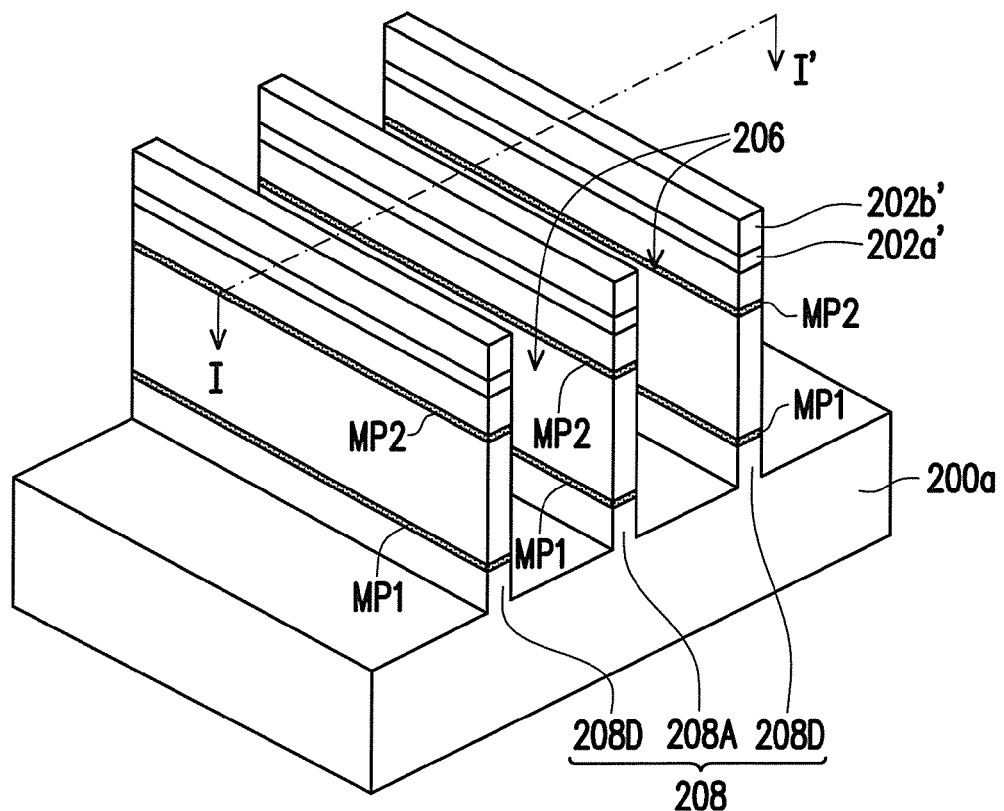
Figure 3B:
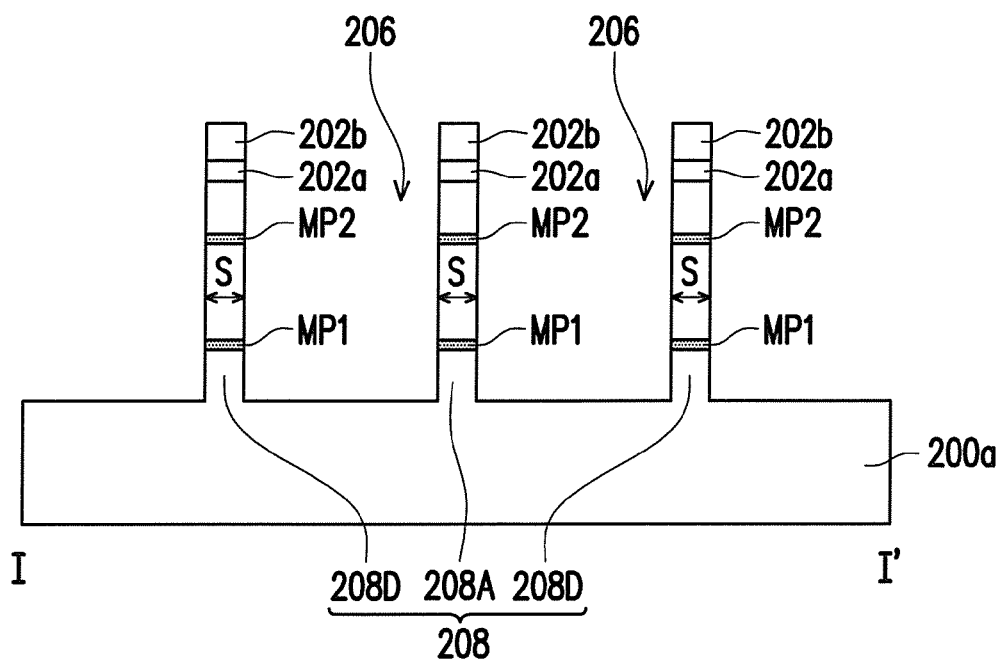

FIG. 2B is a perspective view of the FinFET at one of various stages of the manufacturing method, and FIG. 3B is a cross-sectional view of the FinFET taken along the line I-I' of FIG. 2B. In Step S10 in FIG. 1 and as shown in FIGS. 2A-2B and FIGS. 3A-3B, the mask layer 202b and the pad layer 202a which are not covered by the patterned photoresist layer 204 are sequentially etched to form a patterned mask layer 202b' and a patterned pad layer 202a' so as to expose underlying substrate 200. By using the patterned mask layer 202b', the patterned pad layer 202a' and the patterned photoresist layer 204 as a mask, portions of the substrate 200 are exposed and etched to form trenches 206 and semiconductor fins 208. The semiconductor fins 208 are covered by the patterned mask layer 202b', the patterned pad layer 202a' and the patterned photoresist layer 204. Two adjacent trenches 206 are spaced apart by a spacing S. For example, the spacing S between trenches 206 may be smaller than about 30 nm. In other words, two adjacent trenches 206 are spaced apart by a corresponding semiconductor fin 208.

The height of the semiconductor fins 208 and the depth of the trench 206 range from about 5 nm to about 500 nm. After the trenches 206 and the semiconductor fins 208 are formed, the patterned photoresist layer 204 is then removed. In one embodiment, a cleaning process may be performed to remove a native oxide of the semiconductor substrate 200a and the semiconductor fins 208. The cleaning process may be performed using diluted hydrofluoric (DHF) acid or other suitable cleaning solutions.

After the aforesaid fin etching process is performed, the semiconductor fins 208 comprising two modulation portions MP1 and MP2 distributed therein are formed over the substrate 200a. Material and thickness of the modulation portions MP1 and MP2 is substantially the same with those of modulation materials M1 and M2. However, the number of the modulation portions MP1 and MP2 is not limited in the present disclosure. For example, each semiconductor fin 208 may have one or more than two modulation portions. The minimum distance between the modulation portion MP1 and the substrate 200a ranges from 50 nm to 1000 nm and the minimum distance between the modulation portion MP2 and the substrate 200a ranges from 5 nm to 500 nm, for example. In addition, the location of the portions MP1 and MP2 is not limited in the present disclosure. One skilled artisan may modify the number and the location of the modulation portions in the semiconductor fins 208 depending on design requirements.

The modulation portions MP1 and MP2 may modulate or stabilize characteristics of the semiconductor fins 208. For example, the modulation portions MP1 and MP2 are helpful to controls of fin height, stress, electrical characteristics, and so on. Thus the semiconductor fins 208 having modulation portions MP1 and MP2 therein may improve wafer analysis and testing (WAT) result.

As shown in FIG. 2B and FIG. 3B, the semiconductor fins 208 comprise at least one active fin 208A and a pair of dummy fins 208D disposed at two sides of the active fin 208A. In other words, one of the dummy fins 208D is disposed at a side of the active fin 208A and the other one of the dummy fins 208D is disposed at the other side of the active fin 208A. In some embodiments, the height of the active fin 208A and the height of the dummy fins 208D are substantially the same. For example, the height of the active fin 208A and the dummy fins 208D is between about 10 angstroms to about 1000 angstroms. The dummy fins 208D can protect the active fin 208A from suffering fin-bending issue resulted from sequential deposition processes. Furthermore, the dummy fins 208D can prevent the active fin 208A from being seriously affected by loading effect during fin-etching process.

Figure 2C:
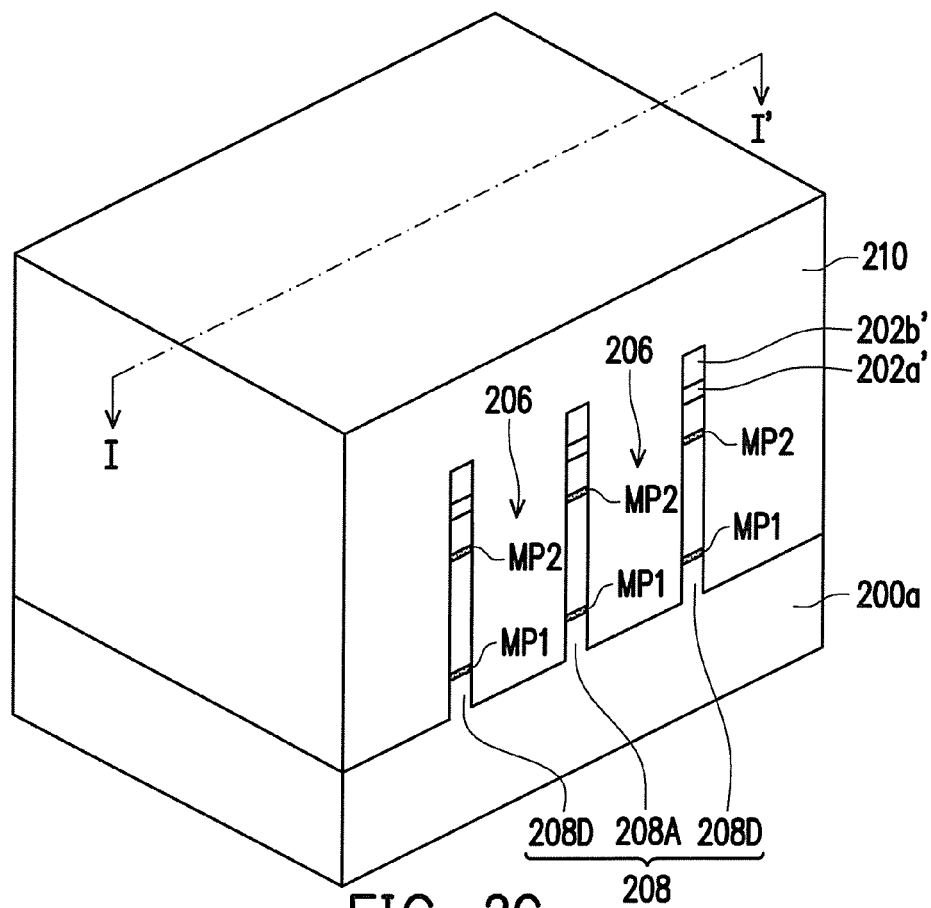
Figure 3C:
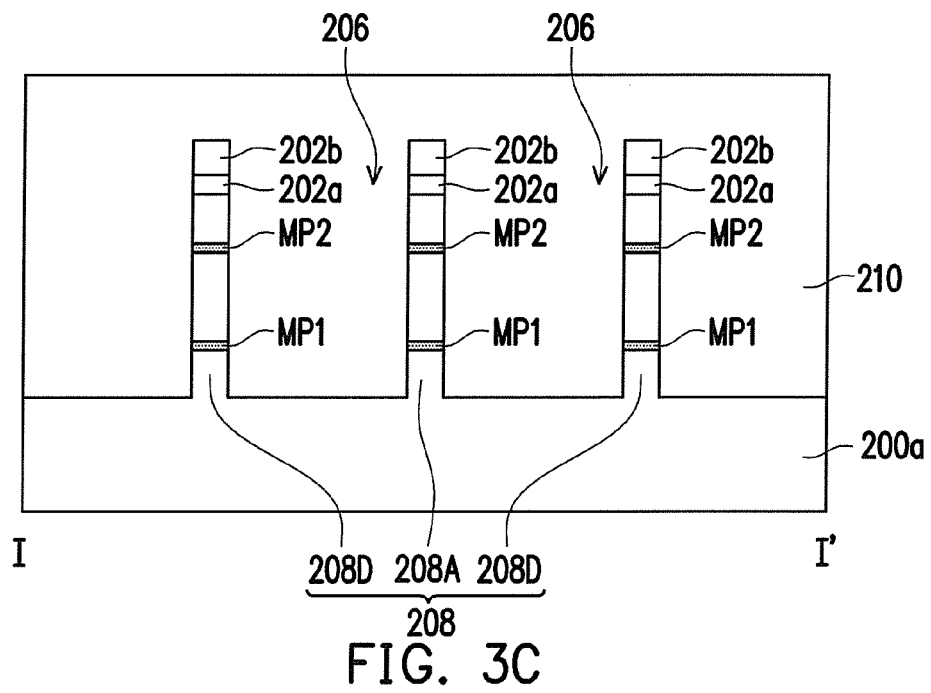

FIG. 2C is a perspective view of the FinFET at one of various stages of the manufacturing method, and FIG. 3C is a cross-sectional view of the FinFET taken along the line I-I' of FIG. 2C. In Step S12 in FIG. 1 and as shown in FIGS. 2B-2C and FIG. 3B-3C, an insulating material 210 are formed over the substrate 200a to cover the semiconductor fins 208 and fill up the trenches 206. In addition to the semiconductor fins 208, the insulating material 210 further covers the patterned pad layer 202a' and the patterned mask layer 202b'. The insulating material 210 may include silicon oxide, silicon nitride, silicon oxynitride, a spin-on dielectric material, or a low-K dielectric material. The insulating material 210 may be formed by high-density-plasma chemical vapor deposition (HDP-CVD), sub-atmospheric CVD (SACVD) or by spin-on.

Figure 2D:
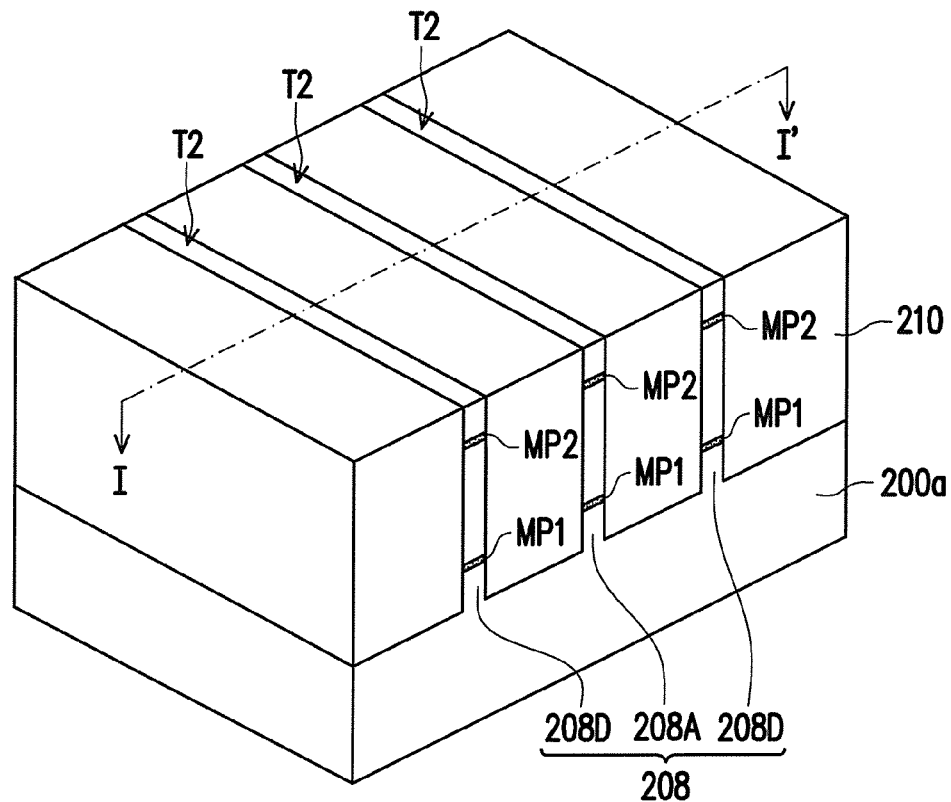
Figure 3D:
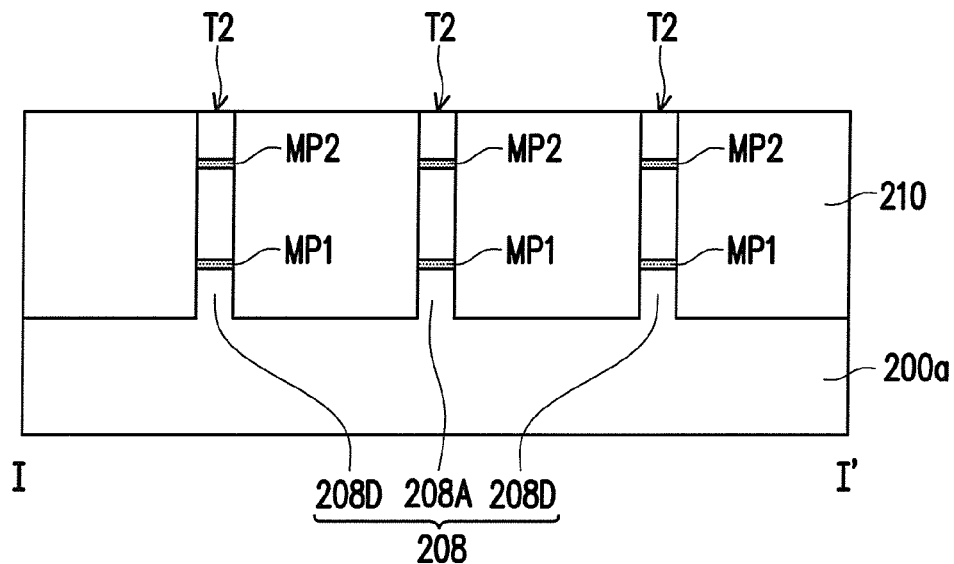

FIG. 2D is a perspective view of the FinFET at one of various stages of the manufacturing method, and FIG. 3D is a cross-sectional view of the FinFET taken along the line I-I' of FIG. 2D. In Step S12 in FIG. 1 and as shown in FIGS. 2C-2D and FIGS. 3C-3D, a chemical mechanical polish process is, for example, performed to remove a portion of the insulating material 210, the patterned mask layer 202b' and the patterned pad layer 202a' until the semiconductor fins 208 are exposed. As shown in FIG. 2D and FIG. 3D, after the insulating material 210 is polished, top surfaces of the polished insulating material 210 is substantially coplanar with top surface T2 of the semiconductor fins.

Figure 2E:
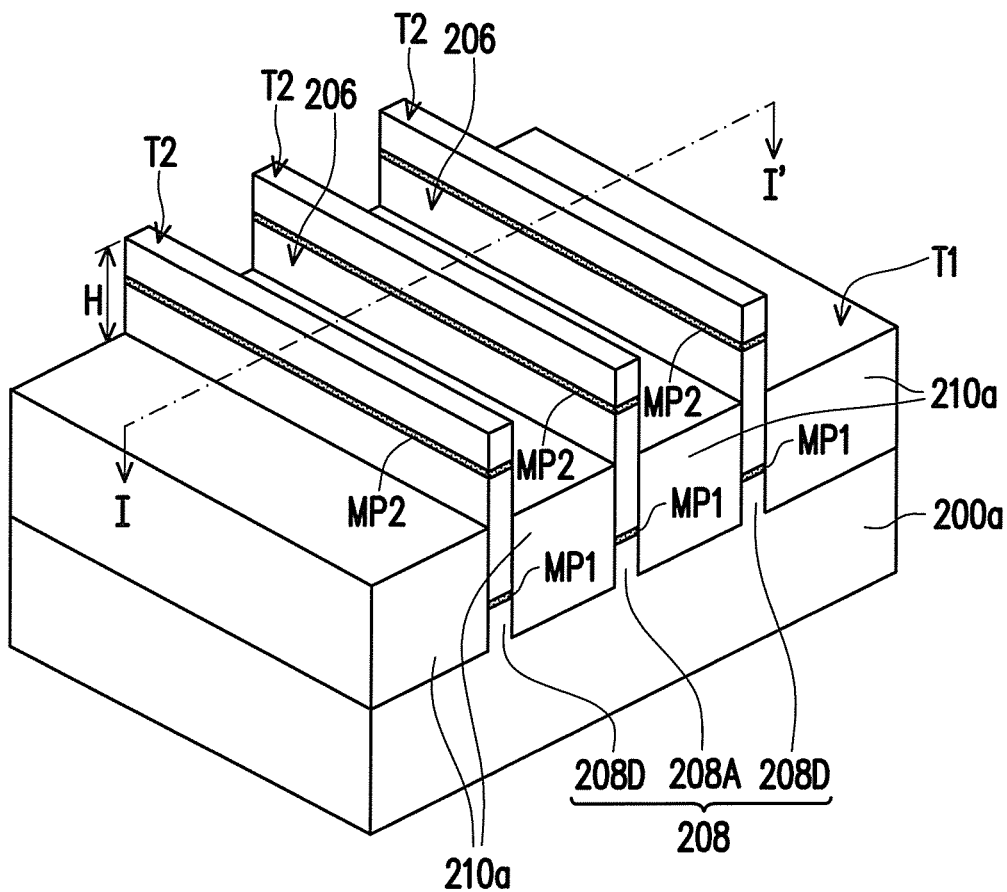
Figure 3E:
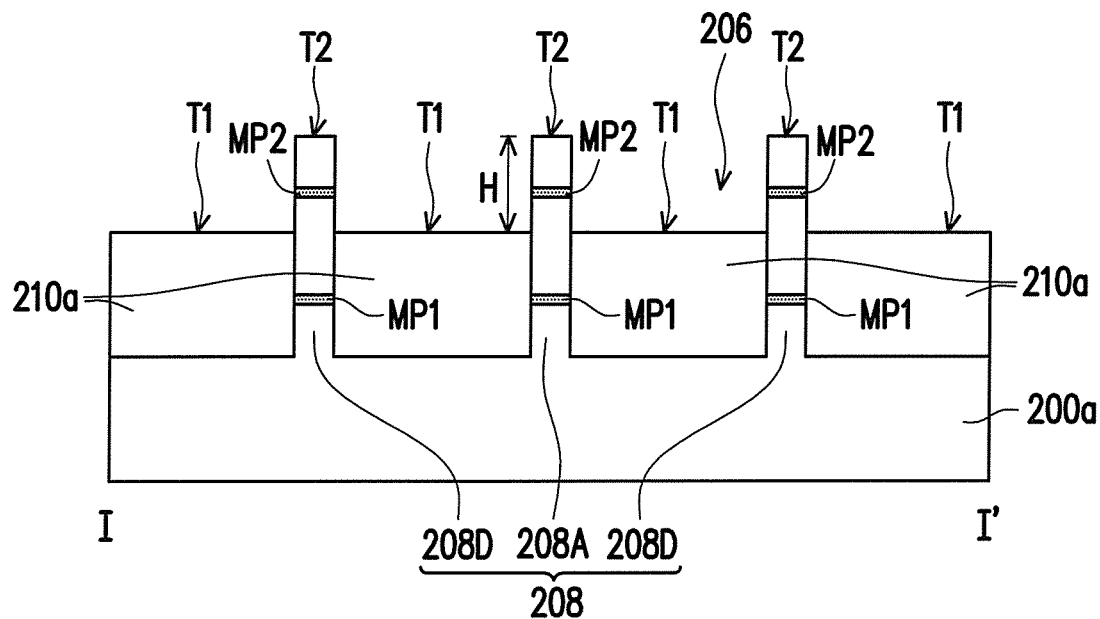

FIG. 2E is a perspective view of the FinFET at one of various stages of the manufacturing method, and FIG. 3E is a cross-sectional view of the FinFET taken along the line I-I' of FIG. 2E. In Step S12 in FIG. 1 and as shown in FIGS. 2D-2E and FIGS. 3D-3E, the polished insulating material 210 filled in the trenches 206 is partially removed by an etching process such that insulators 210a are formed on the substrate 200a and each insulator 210a is located between two adjacent semiconductor fins 208. In one embodiment, the etching process may be a wet etching process with hydrofluoric acid (HF) or a dry etching process. The top surfaces T1 of the insulators 210a are lower than the top surfaces T2 of the semiconductor fins 208. The semiconductor fins 208 protrude from the top surfaces T1 of the insulators 210a. The height difference between the top surfaces T2 of the fins 208 and the top surfaces T1 of the insulators 210a is H, and the height difference H ranges from about 15 nm to about 50 nm.

As shown in FIG. 2E and FIG. 3E, the modulation portions MP2 in the semiconductor fins 208 are exposed and between the top surfaces T1 of the insulators 210a and the top surfaces T2 of the semiconductor fins 208. The modulation portions MP1 in the semiconductor fins 208 are encapsulated by the insulators 210a.

Figure 2F:
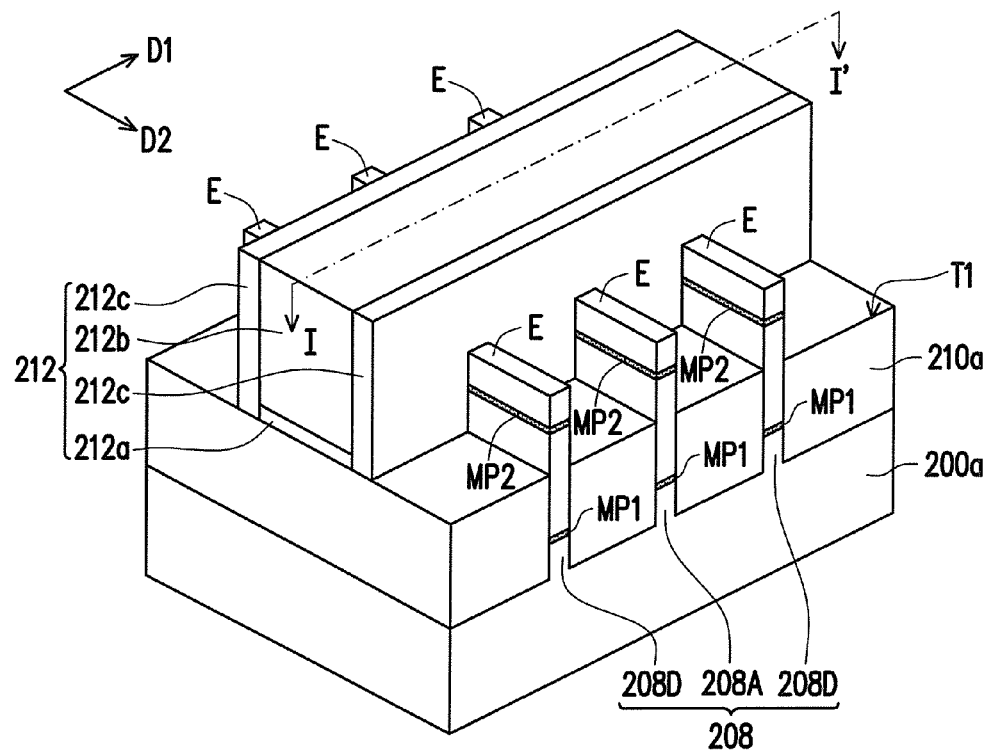
Figure 3F:
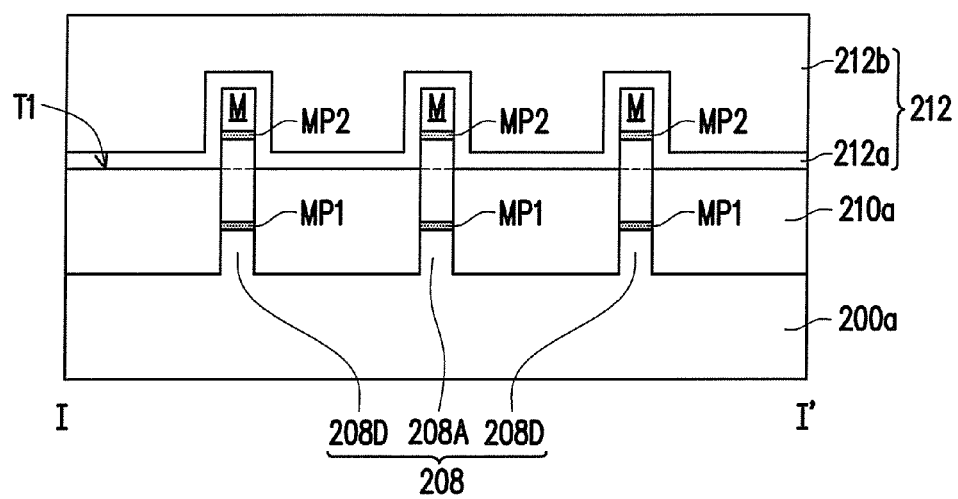

FIG. 2F is a perspective view of the FinFET at one of various stages of the manufacturing method, and FIG. 3F is a cross-sectional view of the FinFET taken along the line I-I' of FIG. 2F. In Step S14 in FIG. 1 and as shown in FIGS. 2E-2F and FIGS. 2F-3F, a gate stack 212 is formed over portions of the semiconductor fins 208 and portion of the insulators 210a. In one embodiment, the extending direction D1 of the gate stack 212 is, for example, perpendicular to the extension direction D2 of the semiconductor fins 208 so as to cover the middle portions M (shown in FIG. 3F) of the semiconductor fins 208. The aforesaid middle portions M may act as channels of the tri-gate FinFET. The gate stack 212 comprises a gate dielectric layer 212a and a gate electrode layer 212b disposed over the gate dielectric layer 212a. The gate dielectric layer 212b is disposed over portions of the semiconductor fins 208 and over portions of the insulators 210a.

The gate dielectric 212a is formed to cover the middle portions M of the semiconductor fins 208. In some embodiments, the gate dielectric layer 212a may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In one embodiment, the gate dielectric layer 212a is a high-k dielectric layer with a thickness in the range of about 10 to 30 angstroms. The gate dielectric layer 212a may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212a may further comprise an interfacial layer (not shown) to reduce damage between the gate dielectric layer 212a and semiconductor fins 208. The interfacial layer may comprise silicon oxide.

The gate electrode layer 212b is then formed on the gate dielectric layer 212a. In some embodiments, the gate electrode layer 212b may comprise a single layer or multi-layered structure. In some embodiments, the gate electrode layer 212b may comprise poly-silicon or metal, such as Al, Cu, W, Ti, Ta, TiN, TiAl, TiAlN, TaN, NiSi, CoSi, other conductive materials with a work function compatible with the substrate material, or combinations thereof. In some embodiments, the gate electrode layer 212b includes a silicon-containing material, such as poly-silicon, amorphous silicon or a combination thereof, and is formed prior to the formation of the strained material 214. In alternative embodiments, the gate electrode layer 212b is a dummy gate, and a metal gate (or called "replacement gate") replaces the dummy gate after the strain strained material 214 is formed. In some embodiments, the gate electrode layer 212b comprises a thickness in the range of about 30 nm to about 60 nm. The gate electrode layer 212b may be formed using a suitable process such as ALD, CVD, PVD, plating, or combinations thereof. The aforesaid metal gate electrode layer 212b.

In addition, the gate stack 212 may further comprise a pair of spacers 212c disposed on sidewalls of the gate dielectric layer 212a and the gate electrode layer 212b. The pair of spacer 212c may further cover portions of the semiconductor fins 208. The spacers 212c are formed of dielectric materials, such as silicon nitride or SiCON. The spacers 212c may include a single layer or multilayer structure. Portions of the semiconductor fins 208 that are not covered by the gate stack 212 are referred to as exposed portions E hereinafter.

Figure 2G:
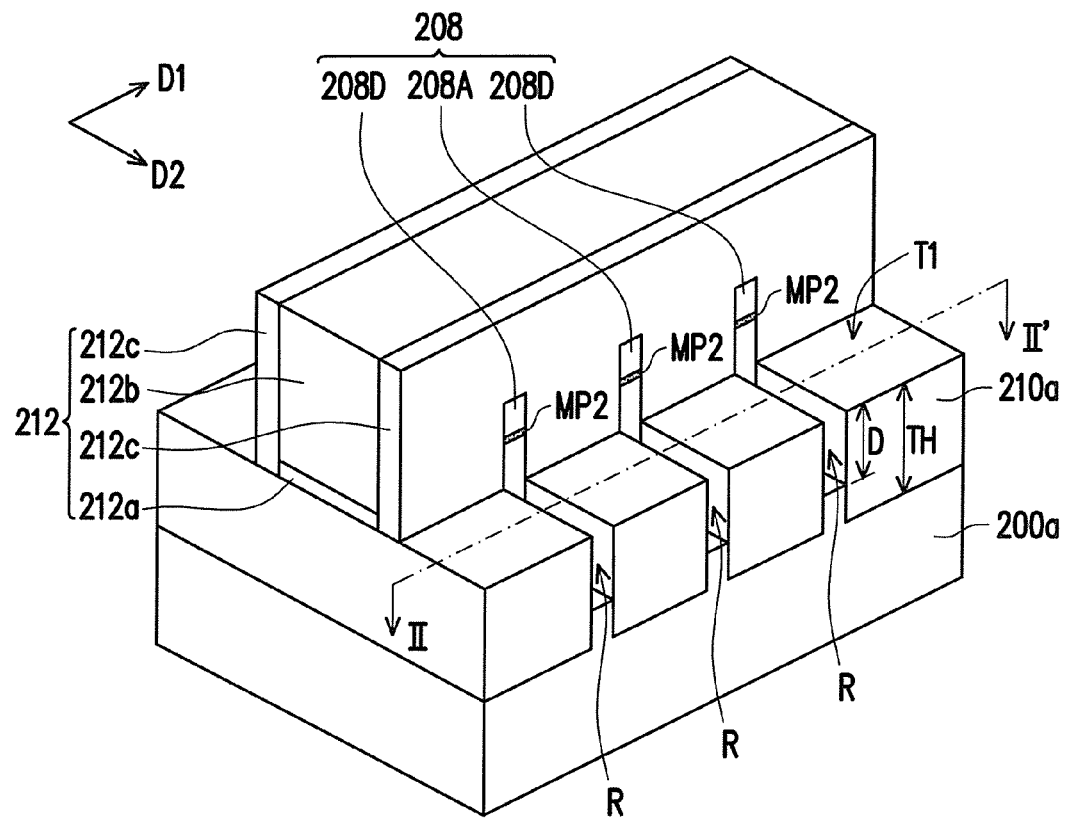
Figure 3G:
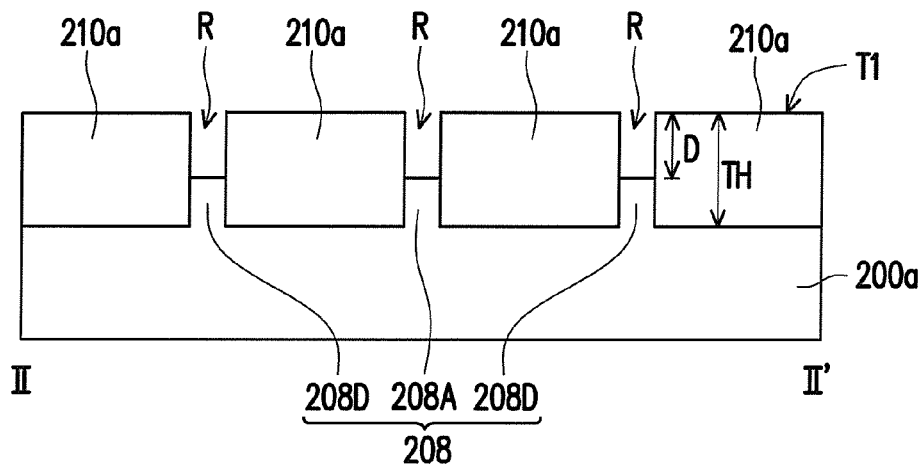

FIG. 2G is a perspective view of the FinFET at one of various stages of the manufacturing method, and FIG. 3G is a cross-sectional view of the FinFET taken along the line II-II' of FIG. 2G. In Step S16 in FIG. 1 and as shown in FIGS. 2F-2G and FIGS. 3F-3G, the exposed portions E of the semiconductor fins 208 are removed and recessed to formed recessed portions R. For example, the exposed portions E are removed by anisotropic etching, isotropic etching or the combination thereof. In some embodiments, the exposed portions E of the semiconductor fins 208 are recessed below the top surfaces T1 of the insulators 210a. The depth D of the recessed portions R is less than the thickness TH of the insulators 210a. In other words, the exposed portions E of the semiconductor fins 208 are not entirely removed. As show in FIG. 2G and FIG. 3G, portions of the semiconductor fins 208 covered by the gate stack 212 is not removed when the exposed portions E of the semiconductor fins 208 are recessed. The portions of the semiconductor fins 208 covered by the gate stack 212 are exposed at sidewalls of the gate stack 212.

When the exposed portions E of the semiconductor fins 208 are removed and recessed to formed recessed portions R, the modulation portion MP1 (shown in FIG. 2F and FIG. 2G) uncovered by the gate stack 212 may act as an etch stop layer to well control the profile of the recessed portions R. During the aforesaid recessing process, the modulation portion MP1 uncovered by the gate stack 212 may be entirely removed. In some alternative embodiments, the aforesaid recessing process may be stop at the modulation portion MP1 and the modulation portion MP1 uncovered by the gate stack 212 remains. Since the modulation portion MP1 is helpful to well control the profile of the recessed portions R, the follow-up epitaxial growth of strained material can be well controlled also. Accordingly, the process window of the follow-up epitaxial process is enlarged.

Figure 2H:
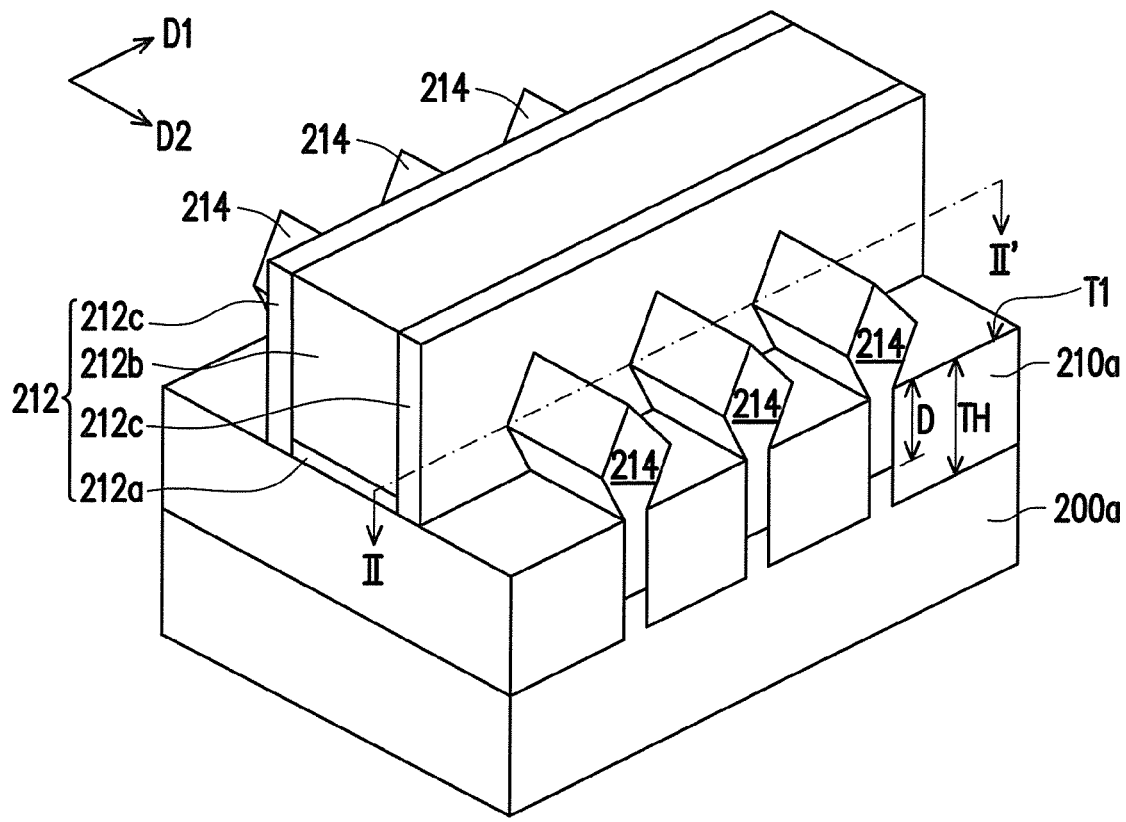
Figure 3H:
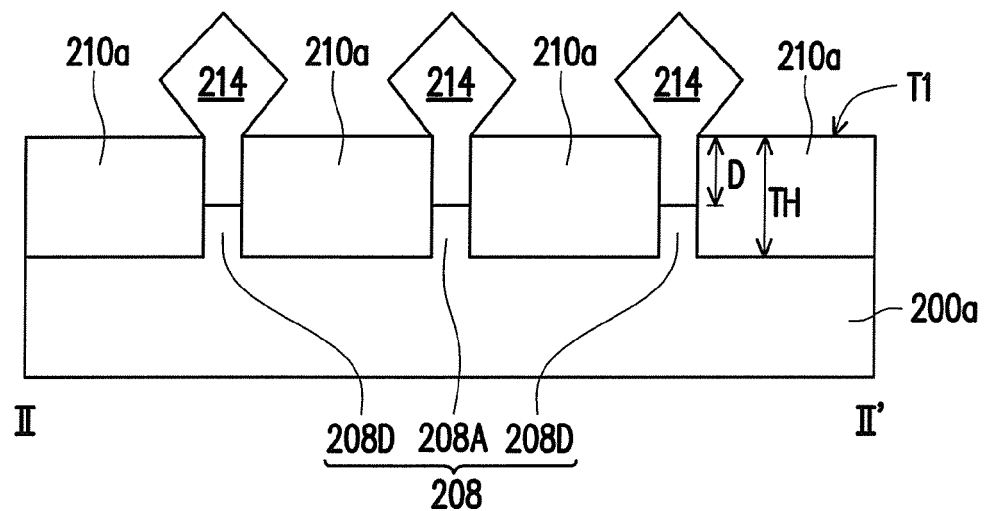

FIG. 2H is a perspective view of the FinFET at one of various stages of the manufacturing method, and FIG. 3H is a cross-sectional view of the FinFET taken along the line II-II' of FIG. 2H. In Step S16 in FIG. 1 and as shown in FIGS. 2G-2H and FIGS. 2G-3H, strained material 214 is selectively grown over the recessed portions R of the semiconductor fin 208 and extends beyond the top surfaces T1 of the insulators 210a to strain or stress the semiconductor fins 208.

As shown in FIG. 2H and FIG. 3H, the strained material 214 comprises sources disposed at a side of the stack gate 212 and drains disposed at the other side of the gate stack 212. The sources cover an end of the semiconductor fins 208 and the drains cover the other end of the semiconductor fin 208. In this case, the dummy fins 208D may be electrically grounded through the strained material 214 covering thereon.

In some embodiments, the sources and drains may merely cover two ends (i.e. a first end and a second end) of the active fin 208A that are revealed by the gate stack 212, and the dummy fins 208D are not covered by the strained material 214. In this case, the dummy fins 208D are electrically floated. Since the lattice constant of the strained material 214 is different from the substrate 200a, the portions of the semiconductor fins 208 covered by the gate stack 212 is strained or stressed to enhance carrier mobility and performance of the FinFET. In one embodiment, the strained material 214, such as silicon carbon (SiC), is epitaxial-grown by a LPCVD process to form the sources and drains of the n-type FinFET. In another embodiment, the strained material 214, such as silicon germanium (SiGe), is epitaxial-grown by a LPCVD process to form the sources and drains of the p-type FinFET.

In the FinFET of the present disclosure, the active fin 208A comprises a channel covered by the gate stack 212 when a driving voltage is bias to the gate stack 212. The dummy fins 208D is electrically floating or electrically grounded. In other words, the dummy fins 208D do not act as channels of transistors though the gate stack 212 and the dummy fins 208D are partially overlapped.

During the fabrication of the FinFET, the dummy fins 208D suffer fin-bending issue (i.e. CVD stress effect) and the active fin 208A is not seriously affected by fin-bending issue. In addition, due to the formation of dummy fins 208D, the active fin 208A is not seriously affected by loading effect and fin-bending issue. The dummy fins 208 may enlarge process window and provide better critical dimension loading for epitaxial process of strained material 214 (strained source/drain). Accordingly, the FinFET comprising dummy fins 208D has better wafer analysis and testing (WAT) result, better reliability performance and better yield performance.

Referring back to FIG. 2A and FIG. 3A, the illustrated semiconductor fins 208 comprise at least one active fin 208A and a pair of dummy fins 208D. However, the number of the active fin 208A and the dummy fins 208D are not limited in the present disclosure. In addition, height of the dummy fins 208D may be modified as well. Modified embodiments are described in accompany with FIG. 4 through FIG. 8.

Figure 4:
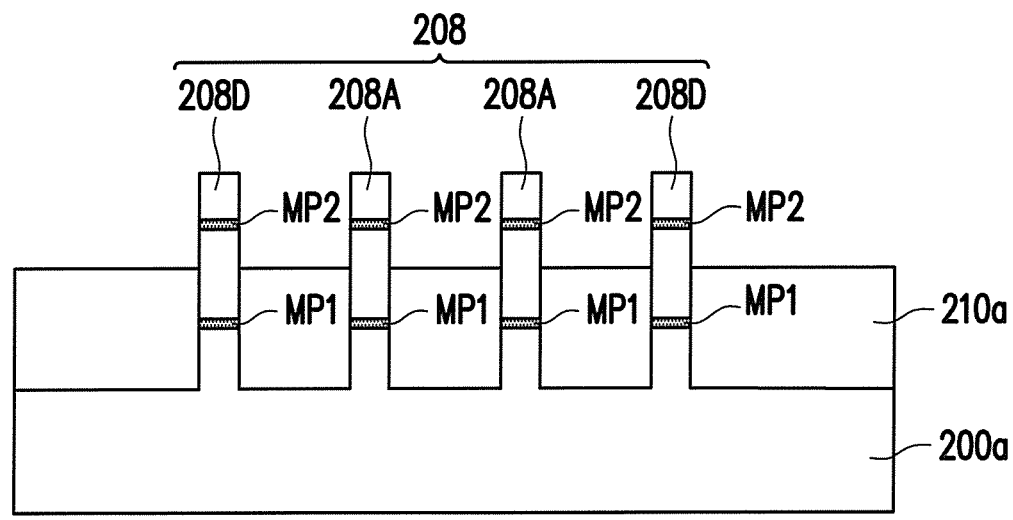
FIGS. 4-8 are cross-sectional views illustrating the semiconductor fins in accordance with some embodiments.

Referring to FIG. 4, illustrated is a cross-sectional view of the semiconductor fins in accordance with some embodiments. The semiconductor fins 208 comprise a group of active fins 208A (e.g. two active fins) and two dummy fins 208D. One dummy fins 208D is disposed at a side of the group of active fins 208A and the other one second dummy fin 208 is disposed at the other side of the group of active fins 208A. In some alternative embodiments, the number of the active fin 208A may be more than two.

Figure 5:
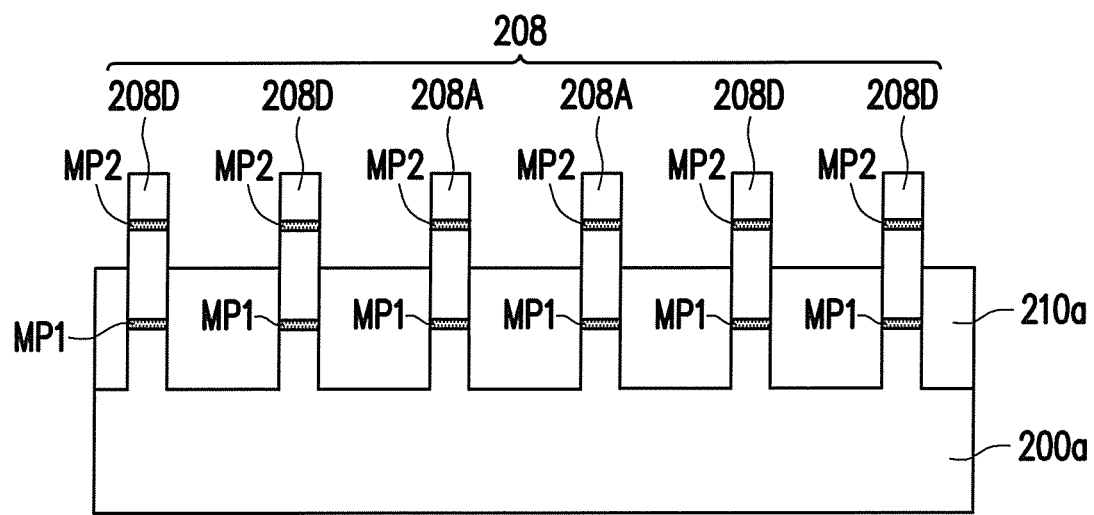

Referring to FIG. 5, illustrated is a cross-sectional view of the semiconductor fins in accordance with some embodiments. The semiconductor fins 208 comprise a group of active fins 208A (e.g. two active fins) and four dummy fins 208D. Two first dummy fins 208D are disposed at a side of the group of active fins 208A and the other two second dummy fins 208D are disposed at the other side of the group of active fins 208A. In some alternative embodiments, the number of the active fin 208A may be more than two and the number of the dummy fins 208D may be three or more than four. The active fins 208A may act as channels of a single FinFET or channels of multiple FinFETs.

Figure 6:
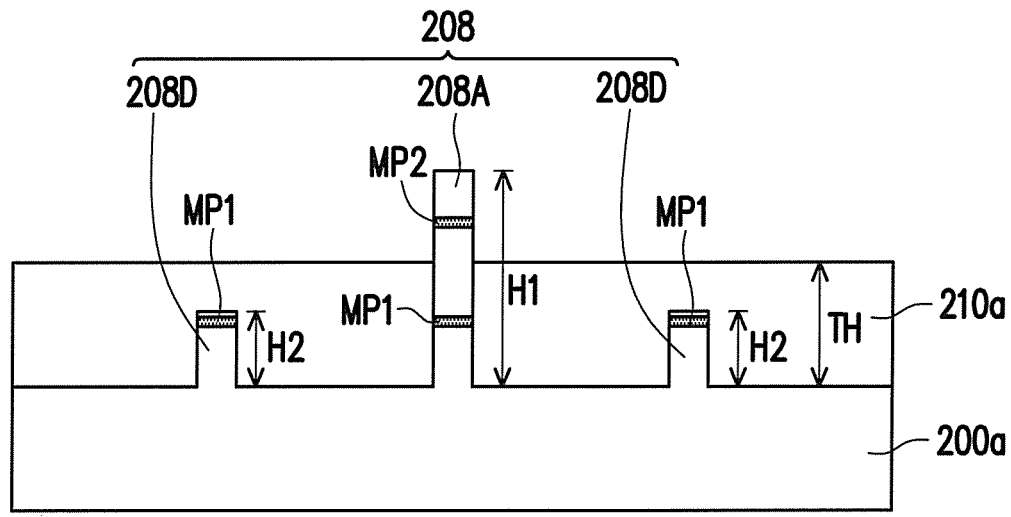

Referring to FIG. 6, illustrated is a cross-sectional view of the semiconductor fins in accordance with some embodiments. The semiconductor fins 208 comprise one active fin 208A and two dummy fins 208D disposed at two opposite sides of the active fin 208A. The height H1 of the active fin 208 is greater than the height H2 of the dummy fins 208D.

Figure 7:
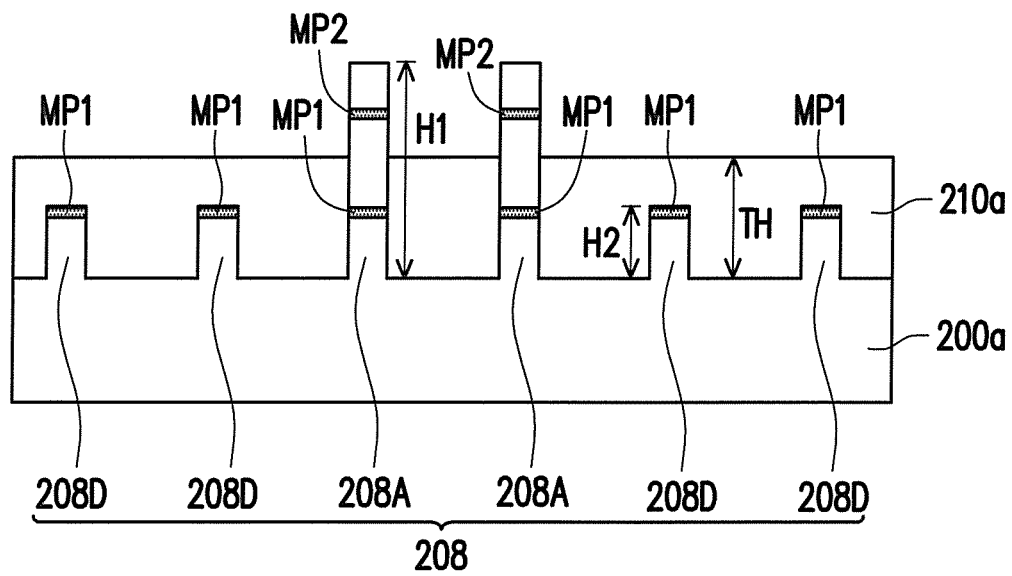

Referring to FIG. 7, illustrated is a cross-sectional view of the semiconductor fins in accordance with some embodiments. The semiconductor fins 208 comprise two active fins 208A and four dummy fins 208D disposed at two opposite sides of the active fins 208A. The height H1 of the active fins 208 is greater than the height H2 of the dummy fins 208D. In some alternative embodiments, the number of the active fin 208A may be more than two and the number of the dummy fins 208D may be three or more than four.

In some alternative embodiments, as shown in FIG. 6 and FIG. 7, the height H2 of the dummy fins 208D is less than the thickness TH of the insulators 210a. Accordingly, the dummy fins 208D are buried in parts of the insulators 210a. The dummy fins 208D are fabricated through a fin-cut process. The fin-cut process may be performed before the insulators 210a are formed such that top portions of the dummy fins 208D are removed to reduce the height of the dummy fins 208D. For example, the fin-cut process may be an etching process. The fin-bending issue (i.e. CVD stress effect) suffered by the shorter dummy fins 208D can be significantly reduced.

Figure 8:
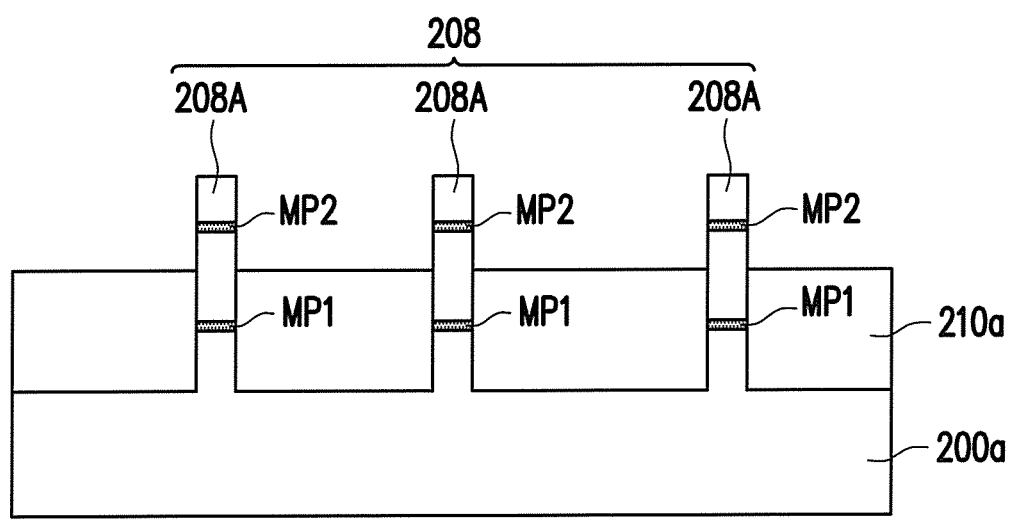

Referring to FIG. 8, illustrated is a cross-sectional view of the semiconductor fins in accordance with some embodiments. Unlike the embodiments illustrated in FIG. 4 through FIG. 7, the semiconductor fins 208 illustrated in FIG. 8 comprise three active fins 208A and no dummy fin are formed. The number of the active fins 208A may be modified depending on design requirements.

In accordance with some embodiments of the present disclosure, a FinFET includes a substrate, a plurality of insulators disposed on the substrate, a gate stack and a strained material. The substrate includes at least one semiconductor fin and the semiconductor fin includes at least one modulation portion distributed therein. The semiconductor fin is sandwiched by the insulators. The gate stack is disposed over portions of the semiconductor fin and over portions of the insulators. The strained material covers portions of the semiconductor fin that are revealed by the gate stack.

In accordance with alternative embodiments of the present disclosure, a FinFET includes a substrate, a plurality of insulators disposed on the substrate, a gate stack and a strained material. The substrate includes a plurality of semiconductor fins. The semiconductor fins includes at least one active fin and a plurality of dummy fins disposed at two opposite sides of the active fin. The active fin includes at least one modulation portion distributed therein. The insulators disposed on the substrate and the semiconductor fins are insulated by the insulators. The gate stack is disposed over portions of the semiconductor fins and over portions of the insulators. The strained material covers portions of the active fin that are revealed by the gate stack.

In accordance with yet alternative embodiments of the present disclosure, a method for fabricating a FinFET includes at least the following steps. At least one semiconductor fin is formed on a substrate, wherein the semiconductor fin includes at least one modulation portion distributed therein. A plurality of insulators are formed on the substrate, wherein the semiconductor fin is sandwiched by the insulators. A gate stack is formed over portions of the semiconductor fin and over portions of the insulators. A strained material is formed over portions of the active fin revealed by the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET), comprising:
a substrate comprising at least one semiconductor fin, the at least one semiconductor fin comprising at least one modulation portion distributed therein;
a plurality of insulators disposed on the substrate, the at least one semiconductor fin being sandwiched by the plurality of insulators, wherein the at least one modulation portion comprises a first modulation portion located above top surfaces of the plurality of insulators and a second modulation portion located below the top surfaces of the plurality of insulators;
a gate stack disposed over portions of the at least one semiconductor fin and over portions of the plurality of insulators; and
a strained material covering portions of the at least one semiconductor fin revealed by the gate stack.

2. The FinFET of claim 1, wherein the at least one modulation portion comprises a semiconductor layer, and a material of the semiconductor layer comprises silicon-germanium oxide ($SiGeO_x$), silicon-germanium (SiGe), silicon oxide ($SiO_x$), silicon phosphide (SiP), silicon phosphate ($SiPO_x$) or a combination thereof.

3. The FinFET of claim 1, wherein the at least one modulation portion comprises an implant region, and a material of the implant region comprises silicon-germanium oxide ($SiGeO_x$), silicon-germanium (SiGe), silicon oxide ($SiO_x$), silicon phosphide (SiP), silicon phosphate ($SiPO_x$) or a combination thereof.

4. The FinFET of claim 1, wherein the strained material comprises a source covering a first end of the at least one semiconductor fin and a drain covering a second end of the at least one semiconductor fin, the first end and the second end are revealed by the gate stack, the source and the drain are located at two opposite sides of the gate stack respectively.

5. The FinFET of claim 1, wherein the at least one semiconductor fin comprises a plurality of recessed portions revealed by the gate stack and the strained material covers the plurality of recessed portions of the at least one semiconductor fin.

6. A fin field effect transistor (FinFET), comprising:
a substrate comprising a plurality of semiconductor fins, the plurality of semiconductor fins comprising at least one active fin and a plurality of dummy fins disposed at two opposite sides of the at least one active fin, the at least one active fin comprising at least one modulation portion distributed therein;
a plurality of insulators disposed on the substrate, the plurality of semiconductor fins being insulated by the plurality of insulators;
a gate stack disposed over portions of the plurality of semiconductor fins and over portions of the plurality of insulators; and
a strained material covering portions of the at least one active fin revealed by the gate stack.

7. The FinFET of claim 6, wherein the at least one modulation portion comprises a semiconductor layer, and a material of the semiconductor layer comprises silicon-germanium oxide ($SiGeO_x$), silicon-germanium (SiGe), silicon oxide ($SiO_x$), silicon phosphide (SiP), silicon phosphate ($SiPO_x$) or a combination thereof.

8. The FinFET of claim 6, wherein the at least one modulation portion comprises an implant region, and a material of the implant region comprises silicon-germanium oxide ($SiGeO_x$), silicon-germanium (SiGe), silicon oxide ($SiO_x$), silicon phosphide (SiP), silicon phosphate ($SiPO_x$) or a combination thereof.

9. The FinFET of claim 6, wherein a height of the at least one active fin is the same with a height of the plurality of dummy fins.

10. The FinFET of claim 6, wherein a height of the at least one active fin is greater than a height of the plurality of dummy fins.

11. The FinFET of claim 10, wherein the plurality of dummy fins are buried in parts of the plurality of insulators.

12. The FinFET of claim 6, wherein the plurality of dummy fins are electrically grounded or electrically floated.

13. The FinFET of claim 6, wherein the at least one modulation portion comprises:
a first modulation portion; and
a second modulation portion, the first modulation portion and the second modulation portion being separately distributed in the at least one active fin.

14. The FinFET of claim 6, wherein the strained material comprises a source covering a first end of the at least one active fin and a drain covering a second end of the at least one active fin, the first end and the second end are revealed by the gate stack, the source and the drain are located at two opposite sides of the gate stack respectively.

15. The FinFET of claim 6, wherein the at least one active fin comprises a plurality of recessed portions revealed by the gate stack and the strained material covers the plurality of recessed portions of the at least one active fin.

16. A method for fabricating a fin field effect transistor (FinFET), comprising:
providing a substrate comprising at least one modulation material distributed therein;
patterning the substrate to form trenches in the substrate and at least one semiconductor fin between the trenches, the at least one semiconductor fin comprising at least one modulation portion distributed therein;
forming a plurality of insulators in the trenches, wherein the at least one modulation portion comprises a first modulation portion located above top surfaces of the plurality of insulators and a second modulation portion located below the top surfaces of the plurality of insulators;
forming a gate stack over portions of the at least one semiconductor fin and over portions of the plurality of insulators; and
forming a strained material over portions of the at least one semiconductor fin revealed by the gate stack.

17. The method of claim 16, wherein the at least one modulation portion is formed in the at least one semiconductor fin by an implantation process or a deposition process.

18. The method of claim 16, wherein a method for fabricating the at least one modulation material distributed in the substrate is formed by ion implantation or atomic layer deposition.

19. The method of claim 16 further comprising:
partially removing portions of the at least one semiconductor fin revealed by the gate stack to form a plurality of recessed portions, wherein the strained material covers the plurality of recessed portions of the at least one semiconductor fin.

* * * * *